US007953566B2

(12) United States Patent
Yoshinaga

(10) Patent No.: US 7,953,566 B2
(45) Date of Patent: May 31, 2011

(54) ELECTROMAGNETIC INTERFERENCE REDUCTION CALCULATION METHOD, DEVICE, AND PROGRAM, AND ITS ELECTRONIC CIRCUIT

(75) Inventor: Takashi Yoshinaga, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/573,883

(22) PCT Filed: Aug. 22, 2005

(86) PCT No.: PCT/JP2005/015593
§ 371 (c)(1),
(2), (4) Date: Mar. 16, 2007

(87) PCT Pub. No.: WO2006/019196
PCT Pub. Date: Feb. 23, 2006

(65) Prior Publication Data
US 2008/0077337 A1 Mar. 27, 2008

(30) Foreign Application Priority Data
Aug. 20, 2004 (JP) .................................. 2004-240651

(51) Int. Cl.
G01R 3/00 (2006.01)
(52) U.S. Cl. ................. 702/76; 702/75; 702/79; 702/81
(58) Field of Classification Search .................. 702/57, 702/65, 76, 103, 155, 190, 191; 318/561; 701/16; 713/300; 375/376
See application file for complete search history.

(56) References Cited

U.S. PATENT DOCUMENTS

| 6,178,514 B1 * | 1/2001 | Wood ............................ 713/300 |
| 6,404,834 B1 * | 6/2002 | Hardin et al. ................. 375/376 |
| 7,288,776 B2 * | 10/2007 | Lee et al. .................... 250/493.1 |
| 7,333,527 B2 * | 2/2008 | Greenstreet et al. .......... 375/130 |

FOREIGN PATENT DOCUMENTS

| JP | 05-215794 A | 8/1993 |
| JP | 06-160443 A | 6/1994 |
| JP | 09-080100 A | 3/1997 |
| JP | 11-281698 A | 10/1999 |
| JP | 11-282565 A | 10/1999 |
| JP | 2001-92874 A | 4/2001 |
| JP | 2001-202153 A | 7/2001 |
| JP | 2001-282378 A | 10/2001 |
| JP | 2002-207526 A | 7/2002 |
| JP | 2002-246900 A | 8/2002 |

OTHER PUBLICATIONS

Yamada, T. et., al. "Estimation of the EMI Reduction by Spread Spectrum Clock", The Institute of Electronics, Information and Communication Engineers, Technical Report of the IEICE, Dec. 21, 2001, vol. 101, No. 530, pp. 37-42.

* cited by examiner

Primary Examiner — Michael P Nghiem
Assistant Examiner — Felix E Suarez
(74) Attorney, Agent, or Firm — Sughrue Mion, PLLC

(57) ABSTRACT

A calculation method of electromagnetic interference reduction through spectrum diffusion that is for reducing the electromagnetic interference, in which, when a center frequency of a measurement bandwidth is changed so that a spectrum having the maximum amplitude is included in the measurement bandwidth, of a plurality of spectra generated from the frequency spectrum of an electromagnetic interference signal through the spectrum diffusion, the amplitudes of all spectra included in the measurement bandwidth are added up and the maximum total sum of the amplitudes is divided by the amplitude of the electromagnetic interference signal, hence to estimate the electromagnetic interference reduction.

10 Claims, 8 Drawing Sheets

FIG. 4
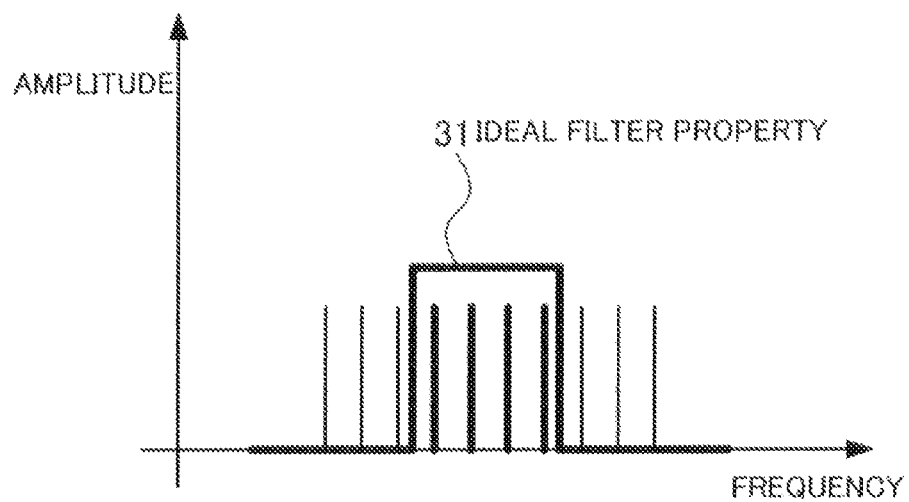
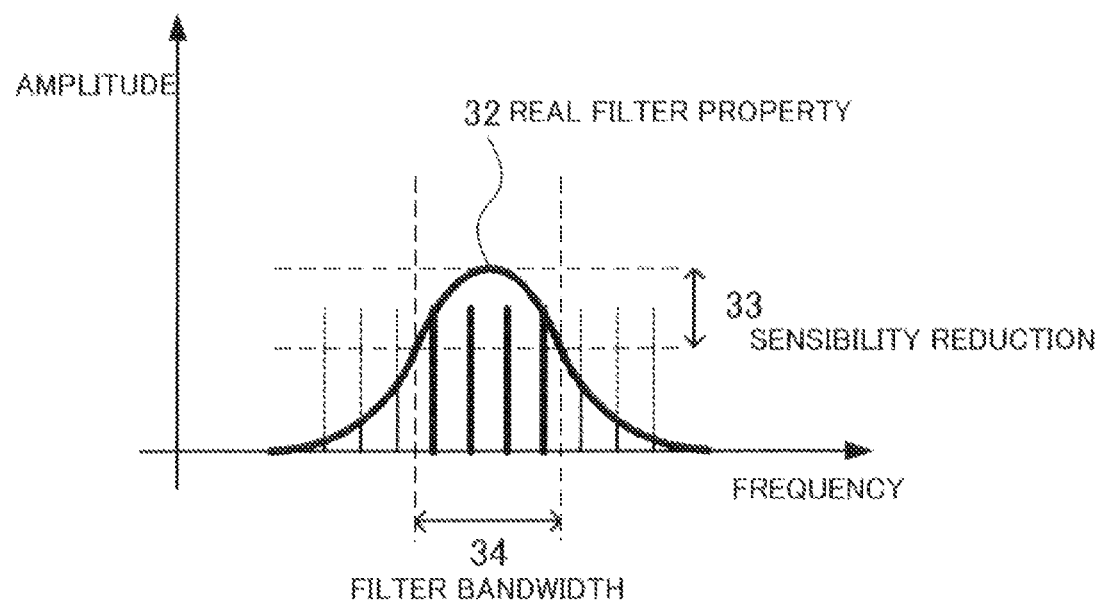

ELECTROMAGNETIC INTERFERENCE REDUCTION CALCULATION METHOD, DEVICE, AND PROGRAM, AND ITS ELECTRONIC CIRCUIT

FIELD OF THE INVENTION

The invention relates to a method of estimating electromagnetic interference reduction, and particularly to an electromagnetic interference calculation method, device, and program, and its electronic circuit which can obtain electromagnetic interference reduction only through calculation, without calibration through the measurement of electromagnetic interference reduction, which calibration is required owing to the influence of the measurement bandwidth of a measurement device, when measuring the electromagnetic interference reduction.

DESCRIPTION OF THE RELATED ART

According to miniaturization of electronic devices, influence of inductive coupling between transmission lines is not negligible in a highly-packed electronic circuit, and there may occur electromagnetic interference (EMI) causing an unexpected malfunction of an electronic circuit. It is known that electromagnetic interference often occurs especially in the clock waveform used for a digital circuit.

In the regulation about the electromagnetic interference, a test method about the discharge amount of the electromagnetic interference and its allowance are defined and the products on the market should satisfy the corresponding EMI regulations.

When each measurement device measures electromagnetic interference, its measurement bandwidth is defined in the standard regulations (in CISPR22 of Comittie International Special des Perturbations Radioelectrique and in VCCI standard based on this international standards): it is defined as 9 kHz in the measurement of a target in a frequency range of 150 kHz to 30 MHz; as 120 kHz, in the frequency range of 30 MHz to 1 GHz; and, as 1 MHz, in the frequency exceeding 1 GHz.

In a spectrum diffusion clock technique, by modulating a clock waveform of defining an operational timing inside a computer according to a frequency modulation technique, the frequency spectrum is expanded and electric power is dispersed, hence to reduce the electromagnetic interference in a specified frequency. Reduction of the electromagnetic interference is controlled while changing a parameter for modulation.

In this method, reduction of the electromagnetic interference is controlled while changing a parameter for frequency modulation. In the conventional design method, however, the electromagnetic interference reduction effect has been evaluated, according to the properties of the electromagnetic interference after a device is completed. Therefore, when a target effect is not obtained, it is necessary to change the design repeatedly.

In the measurement of the electromagnetic interference reduction, when the bandwidth of a measurement device is wider than the modulation frequency, the measured electromagnetic interference reduction depends on the bandwidth of the measurement device disadvantageously and a level difference has to be calibrated according to the bandwidth of the measurement device.

An example of the method about solving this situation is disclosed, for example, in Patent Publication Laid-Open No. 2003-150660 (Document 1).

According to the method disclosed in the document 1, a spectrum distribution of a signal when the clock signal is frequency-modulated is calculated and a theoretical value of the electromagnetic interference reduction is derived, under a condition of given parameters for frequency modulation.

In the method of the document 1, when the bandwidth of a measurement device is wider than the modulation frequency, at first, a calculation method in the case where the bandwidth of a measurement device is narrower than the modulation frequency, in which method the measured electromagnetic interference reduction does not depend on the bandwidth of the measurement device, is used to calculate the frequency, then the frequency is measured by the measurement device, and the calculated value is calibrated by using this measured value, thereby calculating the theoretical value of the electromagnetic interference reduction.

In the method of the document 1, as for a level difference according to the bandwidth of a measurement device, a difference between the measured value and the calculated value is required and the calculated value is calibrated using the difference, hence to estimate the electromagnetic interference suppression effect through calculation.

The above conventional technique has the following problems.

According to the method of document 1, when the bandwidth of a measurement device does not have to be taken into consideration, in other words, when the bandwidth of a measurement device is narrower than the modulation frequency, the electromagnetic interference reduction can be calculated using a calculation formula.

On the other hand, when it has to be taken into consideration, in other words, when the measurement bandwidth of a measurement device is wider than the modulation frequency, the level calibration value needed at that time is obtained through measurement. Therefore, when the measurement bandwidth is wider than the modulation frequency, it requires another measurement for level calibration disadvantageously.

In the case of the conventional method including the method of the document 1, there is a problem that a calculation error occurs because no consideration is taken to a difference between the definition of the measurement bandwidth of a measurement device supposed to be ideal and the definition of an actually measured measurement bandwidth.

In the definition of the ideal measurement bandwidth, an input signal level does not change within a specified band and an input signal is eliminated outside the specified band. Specifically, when the ideal filter property is obtained within the measurement bandwidth of a measurement device, the calculated value can be used as it is.

In the actual measurement device, however, although an input signal does not change in the vicinity of the center frequency within the band, sensibility to the input signal decreases in the frequency in the vicinity of the both ends within the measurement band. Therefore, the influence of the sensibility reduction in the end frequencies within the measurement band has to be taken into account.

Further, even outside a specified band, an input signal is not completely eliminated, but it is detected by a measurement device at a constant rate. This causes an error, which is not negligible.

In the calculation of electromagnetic interference reduction through spectrum diffusion measured by a measurement device having a given measurement bandwidth. In order to solve the above problems of the conventional technique, a first object of the invention is to provide an electromagnetic interference reduction calculation method, device, calculation program, and its electronic circuit which can estimate the electromagnetic interference reduction only through the calculation, without calibration of the electromagnetic interference reduction through measurement which has been required when the measurement bandwidth of the measurement device is wider than the modulation frequency.

A second object of the invention is to provide an electromagnetic interference reduction calculation method, device, program and its electronic circuit which can calibrate the influence of sensibility reduction in a measurement device in the vicinity of the frequency at the both ends within the measurement bandwidth.

SUMMARY OF THE INVENTION

In order to achieve the above objects, the invention is a method of calculating electromagnetic interference reduction through spectrum diffusion that is a means of reducing electromagnetic interference, comprising: adding up the amplitudes of all the spectra included in a measurement bandwidth when a center frequency of the measurement bandwidth is changed so that a spectrum having the maximum amplitude is included in the measurement bandwidth, of a plurality of spectra generated from frequency spectrum of an electromagnetic interference signal through the spectrum diffusion; and estimating electromagnetic interference reduction by dividing the maximum total sum of the amplitudes by the amplitude of the electromagnetic interference signal.

According to the invention of Claim 2, when the measurement bandwidth of the electromagnetic interference reduction is wider than a modulation frequency that is a frequency fluctuation width set through the spectrum diffusion, the amplitudes of the spectra are added up.

According to the conventional calculation method of the electromagnetic interference reduction, when the measurement bandwidth of the electromagnetic interference reduction is wider than the modulation frequency that is a frequency fluctuation width set through the spectrum diffusion, the amplitude of the spectrum having the maximum amplitude included in the measurement bandwidth, of a plurality of spectra generated from the frequency spectrum of the electromagnetic interference signal through the spectrum diffusion, is divided by the amplitude electromagnetic interference signal, hence to estimate the electromagnetic interference reduction.

In this calculation method, since influence of the spectra other than the spectrum having the maximum amplitude is not considered, it is impossible to estimate a reliable electromagnetic interference reduction. Therefore, in the method of the invention, a difference between the calculated value according to the conventional method and the measured value measured under the same conditions is examined previously, and using the result of the difference, the calculated value is calibrated when estimating the electromagnetic interference reduction.

The difference between the calculated value according to the conventional method and the measured value is caused by the influence of sensibility reduction of a measurement device in the frequencies at the both ends of the measurement bandwidth, which is described according to Claim 2 of the invention, in addition to the influence of the spectra other than the spectrum having the maximum amplitude, which has not been a target of the calculation in the conventional method. Thus, the causes of the difference between the calculated value according to the conventional method and the measured value are two. The cause of the difference includes the influence of the spectra other than the influence of the sensibility reduction of a measurement device in the frequencies at the both ends of the measurement bandwidth.

The calculation method according to the invention can be associated with the measured value according to the conventional method as follows.

At first, the amplitudes of all the spectra included in the measurement bandwidth are added up, to estimate the electromagnetic interference reduction. The resultant value is obtained by calibrating the electromagnetic interference reduction obtained in the conventional method, with the influence taken into account, caused by the amplitudes of the spectra other than the spectrum having the maximum amplitude.

Next, the calculated electromagnetic interference reduction is calibrated according to the second calibration with the influence taken into account, caused by the sensibility reduction of a measurement device in the frequencies at the both ends of the measurement bandwidth, hence to estimate the measured value obtained in the conventional method, only through calculation.

BRIEF DESCRIPTION OF THE DRAWINGS

FIG. 4 is a view showing an example of filter property for used in describing the first embodiment of the invention;

DESCRIPTION OF EMBODIED CONFIGURATION OF THE INVENTION

Hereinafter, preferred embodiment of the invention will be described in detail with reference to the drawings.

Figure 1:
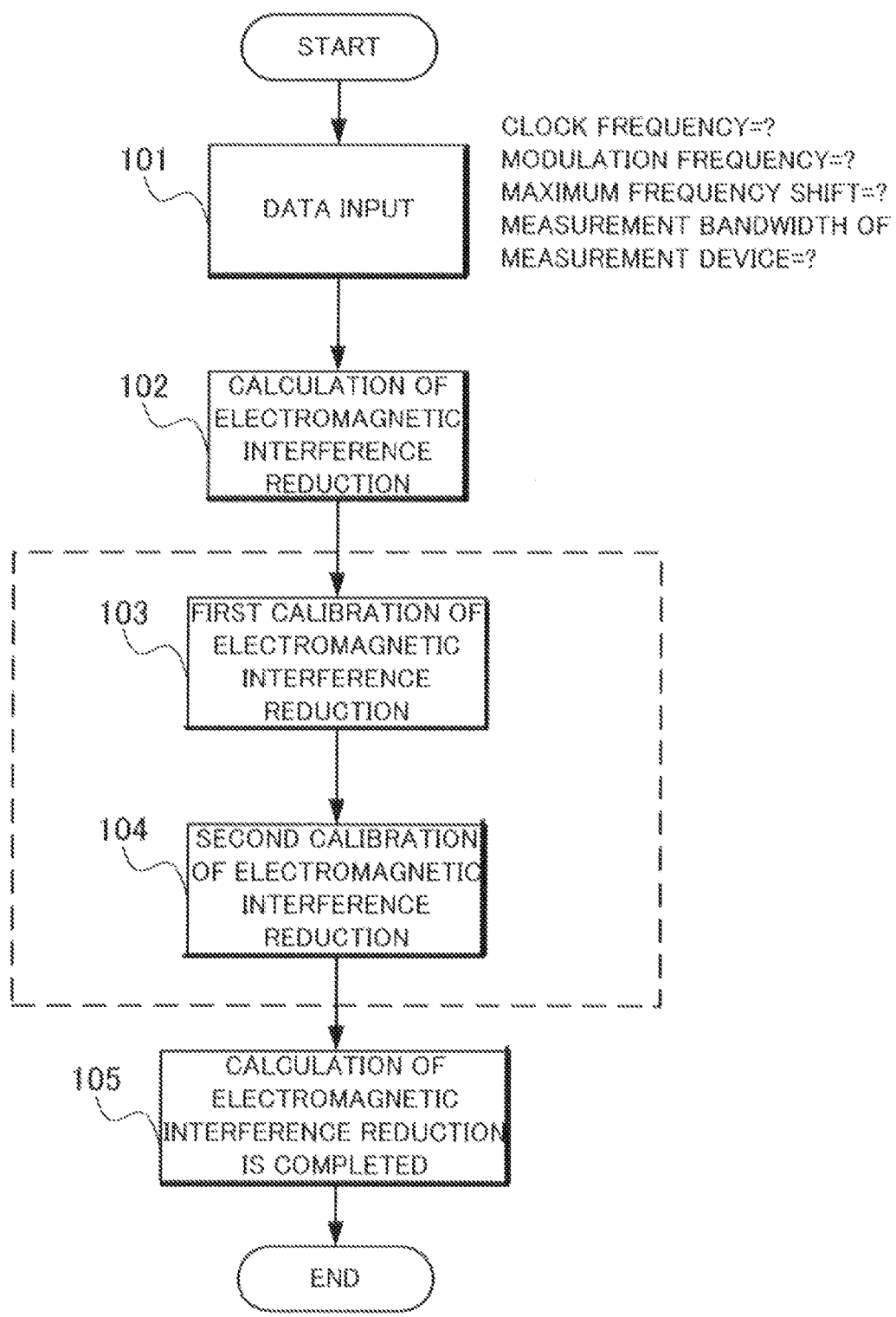
FIG. 1 is a flow chart showing the flow of calculating the electromagnetic interference reduction according to a first embodiment of the invention.

FIG. 1 is a flow chart showing the flow of calculating the electromagnetic interference reduction according to the embodiment.

Referring to FIG. 1, calculation of electromagnetic interference reduction according to the invention includes the following five Steps.

At first, data input is performed. Here, clock frequency, modulation frequency, maximum frequency shift, and measurement bandwidth of a measurement device are supplied (Step 101).

This time, electromagnetic interference reduction is roughly estimated (Step 102).

The Step is performed according to the conventional technique.

A first calibration (Step 102) of the electromagnetic interference reduction and a second calibration (Step 104) of the electromagnetic interference reduction are performed according to a calculation of the invention.

By using the above results, calculation of the electromagnetic interference reduction is completed (Step 105).

Hereafter, each Step of FIG. 1 will be described more specifically.

A rough estimation of the electromagnetic interference reduction according to the conventional technique will be described at first.

It is well known that waveform when a sine wave of carrier frequency f(Hz) is frequency-modulated with a sine wave of modulation frequency $f_m$(Hz) and the maximum frequency shift $\Delta f$(Hz)=f×modulation degree p(%) is given by the formula 1.

The formula 1 is described in, for example,

"Frequency Analysis/Modulation and Noise Theory" written by Toshio Hosono et al. p. 168-178 Kourin Shoinn (1064) and "Radio Communication Technology" written by Isamu Tanimura p. 46-49 Coronasha (1960).

$$a = A\left\{ J_0\left(\frac{\Delta f}{f_m}\right)\sin(2\pi f t + \theta_0) + J_1\left(\frac{\Delta f}{f_m}\right)\sin\{2\pi(f + f_m)t + \theta_0\} - \right.$$
$$J_1\left(\frac{\Delta f}{f_m}\right)\sin\{2\pi(f - f_m)t + \theta_0\} +$$
$$J_2\left(\frac{\Delta f}{f_m}\right)\sin\{2\pi(f + 2f_m)t + \theta_0\} -$$
$$J_2\left(\frac{\Delta f}{f_m}\right)\sin\{2\pi(f - 2f_m)t + \theta_0\} +$$
$$J_3\left(\frac{\Delta f}{f_m}\right)\sin\{2\pi(f + 3f_m)t + \theta_0\} -$$
$$\left. J_3\left(\frac{\Delta f}{f_m}\right)\sin\{2\pi(f - 3f_m)t + \theta_0\} + \ldots \right\}$$

Formula (1)

Wherein, $J_n(x)$ indicates the Bessel function, $\theta_0$ indicates the initial value of each frequency. Å indicates the amplitude of a clock waveform, t indicates a time, and n indicates the order of the Bessel function.

The term of $J_n(\Delta f/f_m)$ indicates the amplitude of each spectrum and the term of sin $\{2p(f+nf_m)t\}$ indicates a time change of each spectrum.

In other words, the formula 1 is an aggregate of signals different in amplitude and frequency. When a signal component corresponding to the term having the largest amplitude is selected, in this aggregation, it means that the electromagnetic interference reduction is the smallest. The electromagnetic interference reduction is evaluated according to the measurement of the electromagnetic interference reduction (worst value) corresponding to the term having the largest amplitude.

Figure 2:
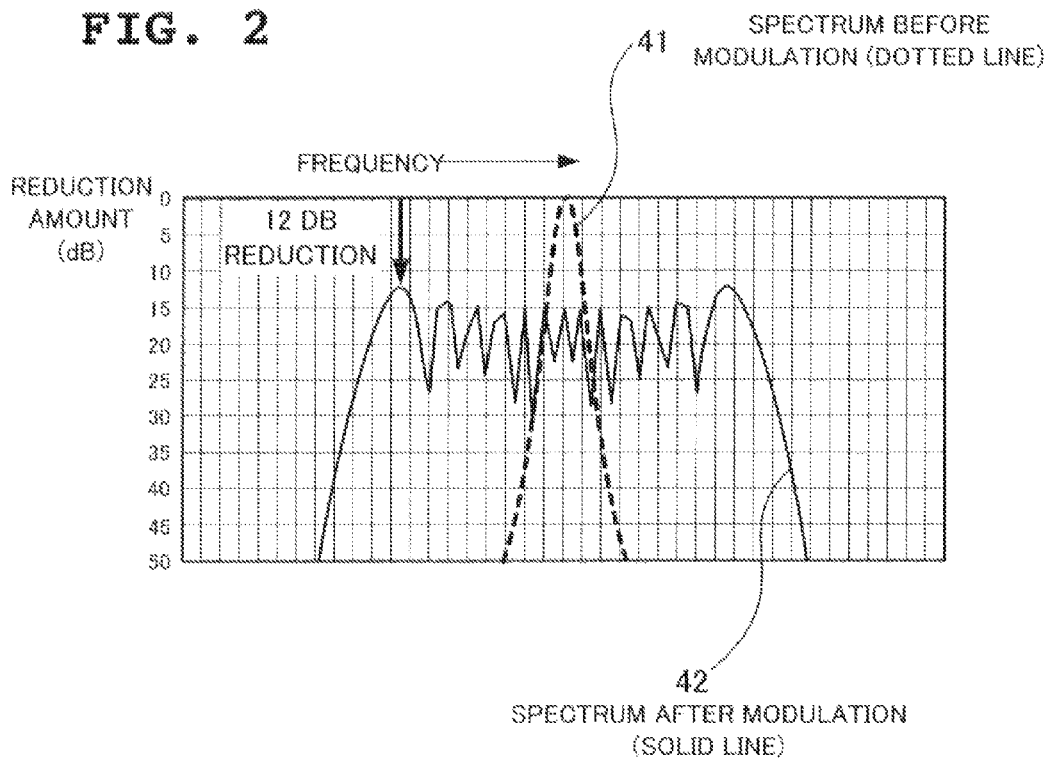
FIG. 2 is a view showing one example of a frequency spectrum waveform in an envelope display for use in describing the first embodiment of the invention.

FIG. 2 is a view showing one example of the frequency spectrum waveform in an envelope display for use in describing the embodiment.

With reference to FIG. 2, it is found that the spectrum 41 before modulation is narrow and that the frequency band is narrow. The spectrum 41 before modulation corresponds to the spectrum before the spectrum diffusion clock technique is adopted there. The reduction amount in FIG. 2 is shown with the amplitude before modulation set at 0 dB (decibel).

The spectrum 42 after modulation, however, expands in frequency band through frequency modulation and the electromagnetic interference is reduced.

In FIG. 2, the electromagnetic interference reduction caused by modulation is about 12 dB at the minimum.

The spectrum diffusion clock technique is a technique for reducing a level of the electromagnetic interference by using the frequency modulation, and this modulation may use a waveform other than a sine wave. The frequency spectrum component in the case of using a waveform other than a sine wave is different from that in FIG. 2, but it becomes the substantially same spectrum, and therefore, even in various kinds of modulations using a waveform other than a sine wave, the formula 1 may be used to calculate the reduction roughly.

As mentioned above, the processing of roughly calculating the electromagnetic interference reduction has been described.

A calculation method the electromagnetic interference reduction according to the embodiment will be described.

As mentioned in FIG. 1, the calculation method of the electromagnetic interference reduction according to the invention includes the first calibration of the electromagnetic interference reduction and the second calibration of the electromagnetic interference reduction.

At first, the first calibration of the electromagnetic interference reduction will be described.

Figure 3:
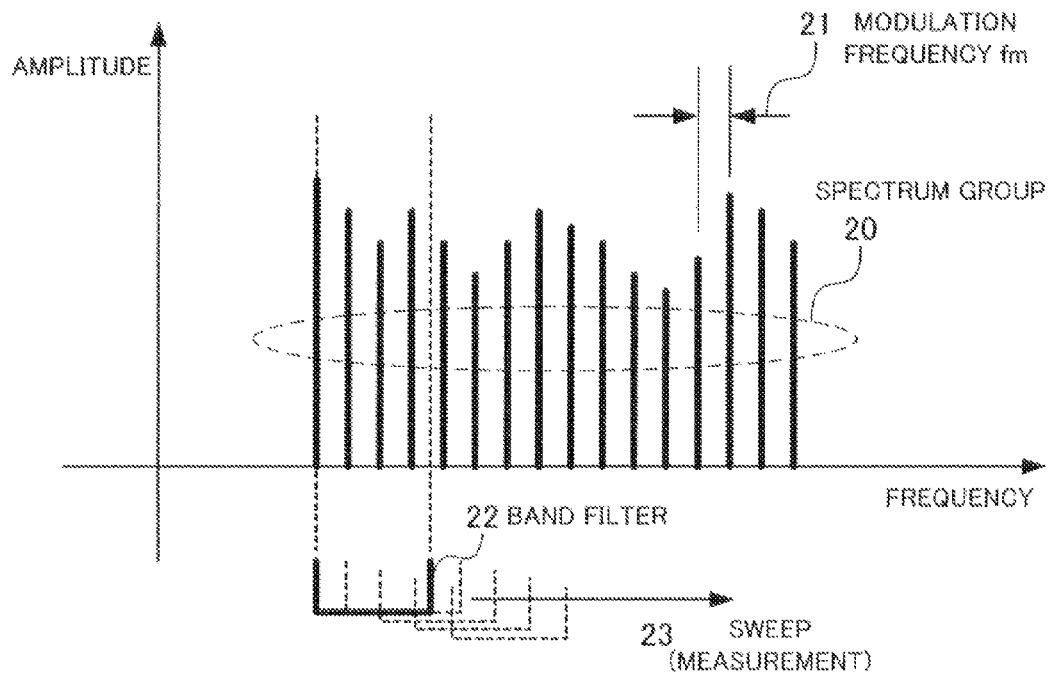
FIG. 3 is a view showing one example of a frequency spectrum waveform in a line spectrum display for use in describing the first embodiment of the invention.

FIG. 3 is a view showing one example of the frequency spectrum waveform in a line spectrum display for use in describing the embodiment.

In FIG. 3, since each time change and amplitude of a spectrum group 20 can be calculated according to sin $\{2p(f+nf_m)t\}$, $J_n(\Delta f/f_m)$ forming the formula 1 as mentioned above, the time change and amplitude of each line spectrum can be calculated easily.

That is, when the maximum frequency shift $\Delta f$ and the modulation frequency $f_m$ are known and the order of the Bessel function is specified, amplitude can be required using the Bessel function. The time change can be calculated according to $2p(f+nf_m)t$ of sin $\{2p(f+nf_m)t\}$.

When the bandwidth of a band filter 22 is narrower than that of the modulation frequency 21, this calculation can be executed without problem because the spectrum detected by the measurement device is only one spectrum.

On the other hand, when it is wider than that of the modulation frequency 21, a plurality of spectra may pass the band filter 22 of the measurement device and enter the measurement device. In this case, the value of the vector sum of amplitudes of all spectra is a real measured value.

When a plurality of spectra pass the band filter 22 of the measurement device and enter the measurement device, calibration is performed while taking the influence on the measured value of the spectra into account, which is the first calibration of the electromagnetic interference reduction according to the invention.

Hereinafter, the first calibration of the electromagnetic interference reduction will be described.

At first, a spectrum having the minimum electromagnetic interference reduction, in other words, having the maximum amplitude $J_n(\Delta f/f_m)$ is selected.

When the measurement bandwidth of a measurement device is narrower than the bandwidth of the modulation frequency, a target spectrum for calculation is one and the absolute value (<1) of this amplitude becomes a reduction rate as it is and there is not need of calibration. Here, the amplitude before modulation is set at 1.

When the measurement bandwidth (RBW) of a measurement device is wider than the bandwidth of the modulation frequency, a target for calculation is a plurality of spectra. Therefore, calibration is required in the conventional calculation method of selecting only one spectrum having the maximum amplitude $J_n(\Delta f/f_m)$.

Specifically, all the amplitudes $J_n(\Delta f/f_m)$ of a plurality of adjacent spectra within the measurement bandwidth (RBW) are added together, and a value obtained by the absolute value of the largest one of the results is defined as the electromagnetic interference reduction.

According to the first calibration of the electromagnetic interference reduction, a level reduction rate is decreased more than in the general case of one spectrum and this decrease is caused by the calibration.

The frequency at this time is determined from the selected n easily and the frequency can be calculated according to $(f+nf_m)$ and $(f-nf_m)$.

The number of spectra Sn to be calculated is given by the formula 2. For example, when RBW=100 kHz and $f_m$=100 kHz, spectra exist at the both ends of the measurement bandwidth and two spectra are targeted.

When $f_m$=50 kHz, spectra exist at the both ends and in the center of the measurement bandwidth and three spectra are targeted.

$$S_n = \text{Int}\left(\frac{RBW}{f_m}\right) + 1 \quad \text{Formula (2)}$$

Where, Int(x) indicates the integer after rounding x, and the RBW indicates the measurement bandwidth of the measurement device.

This time, a second calibration of the electromagnetic interference reduction shown in FIG. 1 will be described. This calibration is performed against sensibility reduction of spectrum caused by deviation of filter property from the ideal property in a measurement device.

FIG. 4 is a view showing an example of the filter property for use in describing the embodiment.

Referring to FIG. 4, the actual filter property 32 is deviated from an ideal filter property 31 represented by rectangular amplitude and it is curved, and as the result, it has a frequency band restriction. The actual filter property 32 can be seen by a spectrum analyzer that is a measurement device of the electromagnetic interference reduction.

As a concrete example, in a typical spectrum analyzer, a filter bandwidth 34 in which sensibility reduction 33 of −3 dB occurs, with respect to the sensibility in the center frequency is defined as a measurement bandwidth.

Referring to FIG. 4, in the calculation using the ideal filter property 31, four spectra may pass the filter without any influence on the amplitude, while in the calculation with the actual filter shape 32 taken into account, two spectra close to the both ends of the filter, of the four spectra, have influence on their amplitudes.

The second calibration is performed with this influence taken into account.

Specifically, after requiring the amplitude of each spectrum according to the formula 1 that is the conventional method, the spectra positioned at the both ends of the filter are calculated with calibration due to the corresponding sensibility reduction, which is the second calibration of the electromagnetic interference reduction.

An example of adopting the invention to a higher harmonic wave will be described.

The above description has been made in the case where an electromagnetic interference signal with the time change shown in sine (sinusoidal) wave is modulated by sine wave. While, in the modulation according to the spectrum diffusion clock technique, an electromagnetic interference signal is modulated by clock wave, that is, rectangle wave.

The rectangle wave is a composite wave of a basic sine wave and the higher harmonic wave, the electromagnetic interference reduction is important also in the higher harmonic wave, and the electromagnetic interference reduction calculation is required in the higher harmonic wave included in the rectangle wave.

In the case of the higher harmonic wave, it is basically the same as in the case of sine wave, and the same calculation is enabled by handling the variables concerned about the modulation of the N-order higher harmonic wave as follows.

When calculating the N-order higher harmonic wave of the sine wave that is a basic wave of clock, carrier frequency $f_N$ used for calculation as a carrier is represented as follows, using the clock frequency (=carrier frequency)f.

$$f_N = Nf(\text{Hz}) \quad \text{formula (3)}$$

When calculating the N-order higher harmonic wave, the modulation frequency $f_{mN}$ used for calculation as a modulation frequency is represented as follows, using the modulation frequency $f_m$ for clock frequency as it is.

$$f_{mN} = f_m(\text{Hz}) \quad \text{formula (4)}$$

When calculating the N-order higher harmonic wave, the maximum frequency shift $\Delta f_N$ used for calculation as a maximum frequency shift is represented as follows, using the maximum frequency shift $\Delta f$ of clock frequency.

$$\Delta f_N = N\Delta f(\text{Hz}) \quad \text{formula (5)}$$

In the case of the N-order higher harmonic wave, the number of spectra $S_{nN}$ handled here is represented as follows, using the modulation frequency $f_m$ for clock frequency and the measurement bandwidth of a measurement device.

That is, the same formula as the formula 2 is used.

$$S_{nN} = \text{Int}\left(\frac{RBW}{f_m}\right) + 1 \quad \text{Formula (6)}$$

Referring to the flow chart of FIG. 1, an example of adopting it to the higher harmonic wave will be specifically described. The corresponding step number in FIG. 1 is attached to the description corresponding to the flow chart of FIG. 1 at the end of the sentence in parentheses. A comparison between the calculation result in FIG. 1 and the measurement result is described.

At first, clock frequency (carrier frequency), modulation frequency, maximum frequency shift (=clock frequency× modulation degree (%)/100), and measurement bandwidth of a measurement device are supplied (Step 101).

Next, the electromagnetic interference reduction is roughly calculated. The input numeric values are applied to the formula 1, to calculate the amplitude given by the Bessel function. The absolute value of the maximum amplitude is searched for and the order n of the Bessel function $J_n(\Delta f/f_m)$ which gives the maximum amplitude is defined as $n_{max}$ (Step 102).

Next, the bandwidth of a measurement device is compared with the modulation frequency using the formula 2 and the number of spectra within the measurement bandwidth of a measurement device is calculated.

According to the number of spectra calculated in the above, a combination having the maximum total sum of the coefficients of the amplitudes is selected as a combination of a group of adjacent spectra, from the vicinity of the order $n_{max}$ of the Bessel function, for example, $n_{max}-1$, $n_{max}-2$, or $n_{max}+1$, $n_{max}+2$, . . . .

Concretely, when the number of spectra obtained by the formula 2 is two, one combination of the larger total sum is selected from the two combinations: the total sum of the absolute value of the Bessel function given by the order $n_{max}$ and the absolute value of $n_{max}-1$, and the total sum of the absolute value of the Bessel function given by the order $n_{max}$ and the absolute value of $n_{max}+1$.

The total sum obtained in this way corresponds to the first calibration of the electromagnetic interference reduction (Step 103).

A comparison between the result obtained thus and the measured value will be described.

Figure 5:
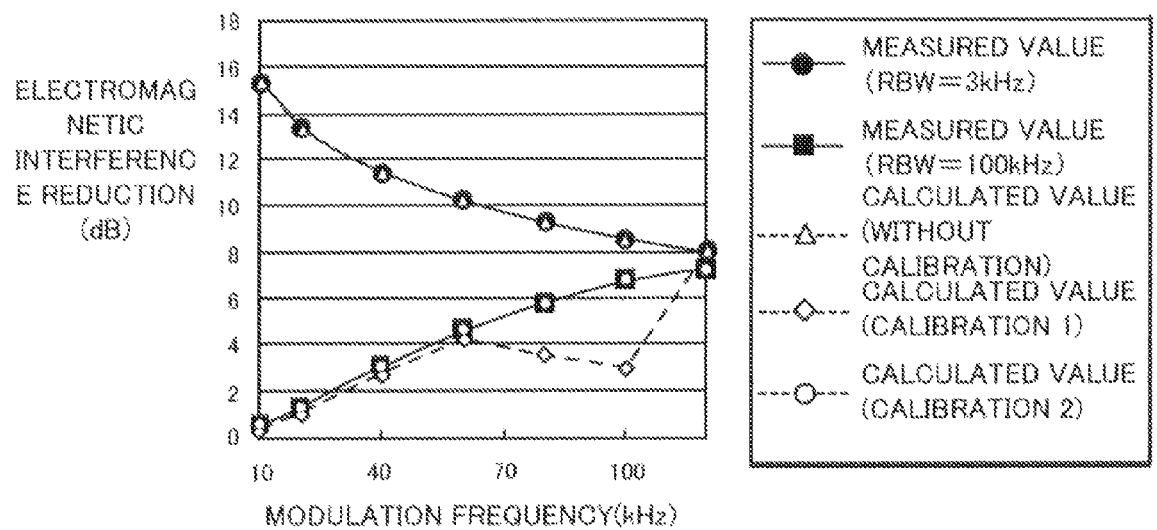
FIG. 5 is a view showing a comparison between the calculated value and the measured value of the electromagnetic interference reduction according to the first embodiment of the invention.

FIG. 5 is a view showing a comparison between the calculated value and the measured value of the electromagnetic interference reduction according to the embodiment.

In FIG. 5, the measured values of the electromagnetic interference reduction effect are plotted when the carrier frequency is set at 50 MHz, the modulation degree is set 1.25%, and the modulation frequency is set at the horizontal axis as a variable. Measurement is performed in the case of RBW=3 kHz (indicated by ●) and in the case of RBW=100 kHz (indicated by |).

The calculation results "no calibration" (indicated by □) are obtained through a rough calculation of electromagnetic interference reduction according to the conventional technique described in Step 102 of FIG. 1, and they agree with the measurement values of RBW=3 kHz. This shows that calibration is not necessary when the measurement bandwidth is narrower than the modulation frequency $f_m$.

According to the measurement results of RBW32 100 kHz, it is found that a large deviation occurs in the range where the modulation frequency $f_m$ is narrower than the measurement bandwidth and that this portion needs calibration.

When the first calibration of the electromagnetic interference reduction is performed (indication by □) according to the embodiment, it is found that they substantially agree with the calculation results until the modulation frequency becomes 60 kHz. However, a deviation from the measured value is found at 60 kHz and more.

Then, the second calibration of the electromagnetic interference reduction (indication by ○) is performed according to the embodiment. The calibrated values agree with the measured values and it is found that the deviation found in the first calibration of the electromagnetic interference reduction is caused by the sensibility reduction in the ends of the filter bandwidth 34.

As mentioned above, by combining the first calibration of the electromagnetic interference reduction with the second calibration of the electromagnetic interference reduction according to the embodiment, it is possible to estimate the electromagnetic interference reduction accurately through calculation when the measurement bandwidth is wider than the modulation frequency.

A method of simplifying the calculation processing according to the embodiment will be described.

Though that the Bessel function $J_n(\Delta f/f_m)$ represents amplitude, the amplitude concerns the electromagnetic interference reduction level, and that the order n giving the maximum amplitude is searched for, has been described, a method of searching for the maximum value easier will be described.

Figure 6:
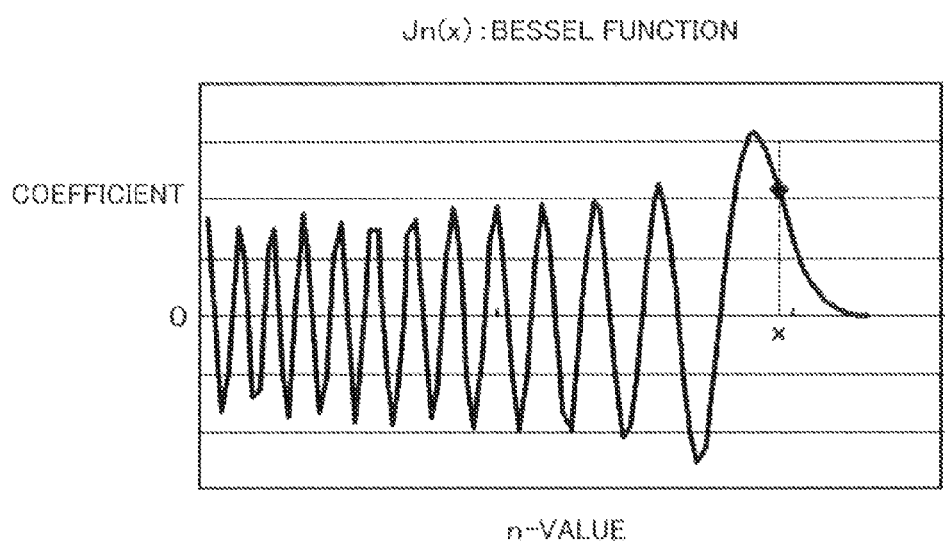
FIG. 6 is a view showing the amplitude obtained by the Bessel function, for use in describing the first embodiment of the invention.

FIG. 6 is a view showing the amplitude obtained by the Bessel function for use in describing the embodiment. The horizontal axis of FIG. 6 is the n-value of the Bessel function.

Referring to FIG. 6, convergence to zero occurs in the vicinity of $n=\Delta f/f_m$ in the Bessel function $J_n(\Delta F/F_m)$. Based on the property of the Bessel function, at first, the vicinity of $n=\Delta f/f_m$ is searched for.

The Bessel function becomes the maximum in the vicinity of $n=\Delta f/f_m$.

As mentioned above, as a method requiring the maximum amplitude easier, $n=\Delta f/f_m$ is first calculated, and then, taking the $S_n$ obtained by the formula 2 into account, amplitude may be calculated in the range of $n=\Delta f/f_m-S_n$ to $n=\Delta f/f_m+S_n$.

In the above method of searching for the maximum value easier, the order giving the maximum amplitude can be found in the order of the Bessel function from $n=\Delta f/f_m-S_n$ to $n=\Delta f/f_m+S_n$. In the range of the order, a combination of the maximum spectrum amplitude corresponding to the number of the spectra included in the measurement bandwidth can be found easier.

In the N-order higher harmonic wave, it may be obtained from $n=\Delta f_N/f_m-NS_n$ to $n=\Delta f_N/f_m+NS_n$.

In this way, search for the maximum value can be simplified extremely.

In the above embodiment, the example of calculating electromagnetic interference reduction according to the given parameters has been described. The reduction amount of electromagnetic interference according to a combination of the parameters including modulation frequency, modulation degree, and the like can be obtained not through measurement but through only calculation and the optimum combination of parameters can be derived theoretically. This is also used as a designing means for determining a parameter of spectrum diffusion at a time of designing an electronic circuit.

A concrete operation example according to the embodiment will be described using the drawings.

A calculation example in the case of the following condition is shown.

Example of Condition clock frequency: 50 MHz
modulation frequency: 100 kHz
modulation degree: 1%
measurement bandwidth (RBW) of a spectrum analyzer that is a measurement device: 100 kHz Under the above conditions, each electromagnetic interference reduction in a basic wave and a second order harmonic wave is required. Referring to FIG. 1 the corresponding step number in the flow chart of FIG. 1 is attached to the corresponding description a the end of sentence in parentheses.

At first, the electromagnetic interference reduction of FIG. 1 is roughly estimated (Step 102).

When $J_n(\Delta f/f_m)$ showing the maximum electromagnetic interference reduction is calculated, the absolute value of the coefficient becomes the maximum value, 0.391, when n=4 (at the frequency of 49.6 MHz and 50.4). That is, in the vicinity of 50 MHz, the level reduction at the frequency of the least electromagnetic interference reduction is 0.391 times as much as that before the modulation.

This time, the first calibration of the electromagnetic interference reduction is performed (Step 103). According to the formula 2, the number of spectra $S_n$ captured at once within the RBW of a measurement device is two.

Here, the method of simplifying the calculation processing according to the embodiment is used.

The respective coefficients indicated by $J_{4-1}(\Delta f/f_m)$ and $J_{4+1}(\Delta f/f_m)$ in the vicinity of n=4 are 0.365 and 0.261.

According to the result, it is found that the maximum amplitude taking the influence by the RBW of a measurement device into account is obtained by a combination of the spectrum of the coefficient 0.391 first obtained and the adjacent spectrum of the coefficient 0.365 (49.6 MHz and 49.7 MHz).

The second calibration of the electromagnetic interference reduction is performed (Step 104). In the second calibration, influence by the detection sensibility reduction of a measurement device is calibrated.

Figure 7:
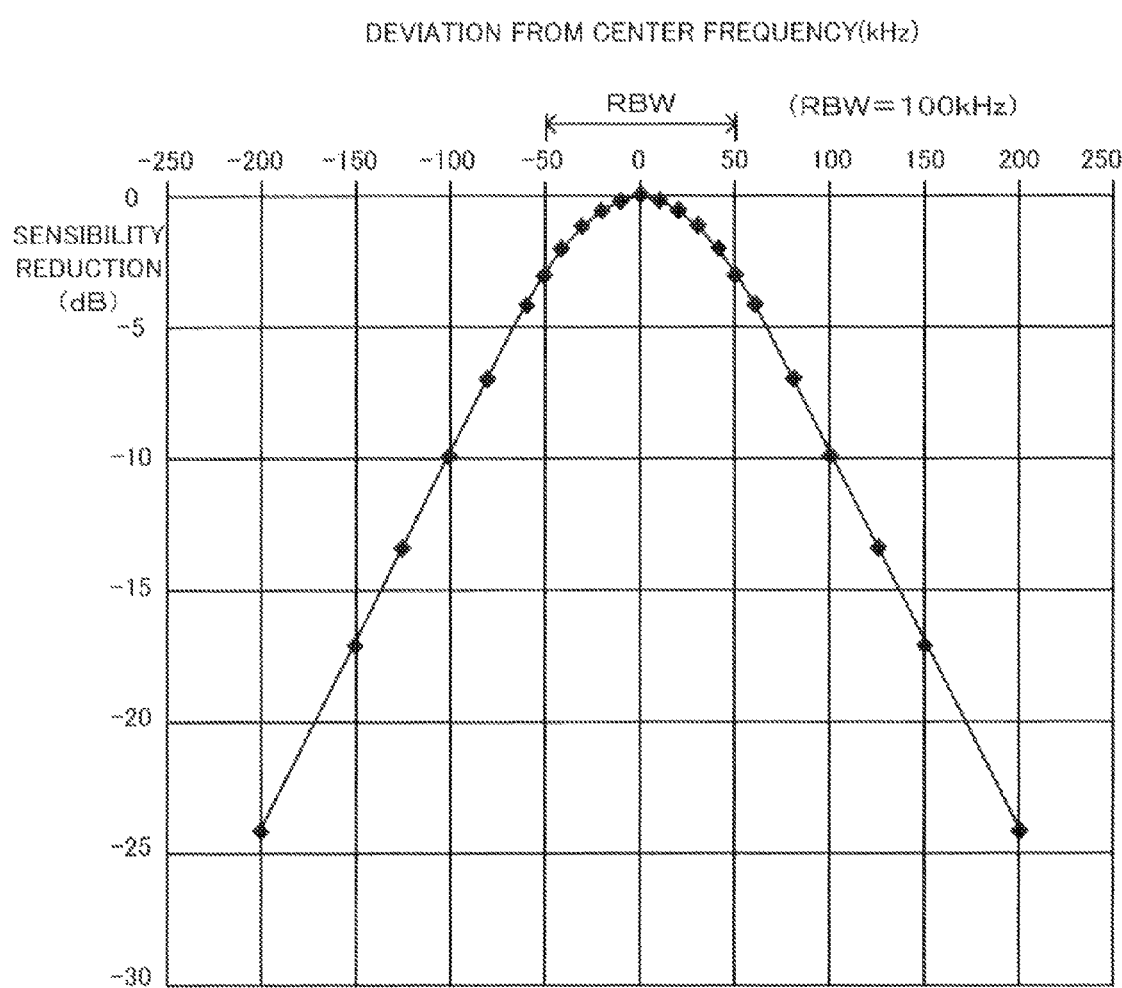
FIG. 7 is a view showing an example of filter property of a measurement device for use in describing the first embodiment of the invention.

FIG. 7 is a view showing an example of the filter property of a measurement device for use in describing the embodiment.

Referring to FIG. 7, the detection sensibility of a measurement device is highest at the outer frequency and it gets lower when it is deviated from the center frequency.

The second calibration of the electromagnetic interference reduction described later is performed by using FIG. 7.

Since the spectra used for calculating the maximum amplitude are positioned at the both ends of the measurement bandwidth, each sensibility reduction in the measurement device is required from FIG. 7 and calibrated by −3 dB.

As the result, 0.391 and 0.365 become 0.277 and 0.258, 0.535 in total, and the electromagnetic interference reduction is 0.535 times as much as the level before the modulation.

With respect for the electromagnetic interference reduction in the second order harmonic wave at the frequency 100 MHz, the setting parameters are replaced with the parameters corresponding to the second order harmonic wave of a clock frequency according to the formula 3, the formula 4, the formula 5, and the formula 6 and calculated in the same way. As the result, the respective coefficients handled in the stage of the first calibration become 0.318 and 0.291, the total sum after the second calibration becomes 0.431, and in the second order harmonic wave, the electromagnetic interference can be reduced 0.431 times.

The above mentioned method of the embodiment is a calculation method of the electromagnetic interference reduction through the spectrum diffusion that is a means of reducing the electromagnetic interference. Of a plurality of spectra generated from the frequency spectrum of an electromagnetic interference signal according to the spectrum diffusion, the center frequency of the measurement bandwidth is changed so that the spectrum having the maximum amplitude may be included in the measurement bandwidth, the amplitudes of all the spectra included in the measurement bandwidth are added together, and the maximum total sum of the amplitudes is divided by the amplitude of the electromagnetic interference signal, hence to calculate the electromagnetic interference reduction.

A calculation device of electromagnetic interference reduction which provided the method of the invention will be described.

Figure 8:
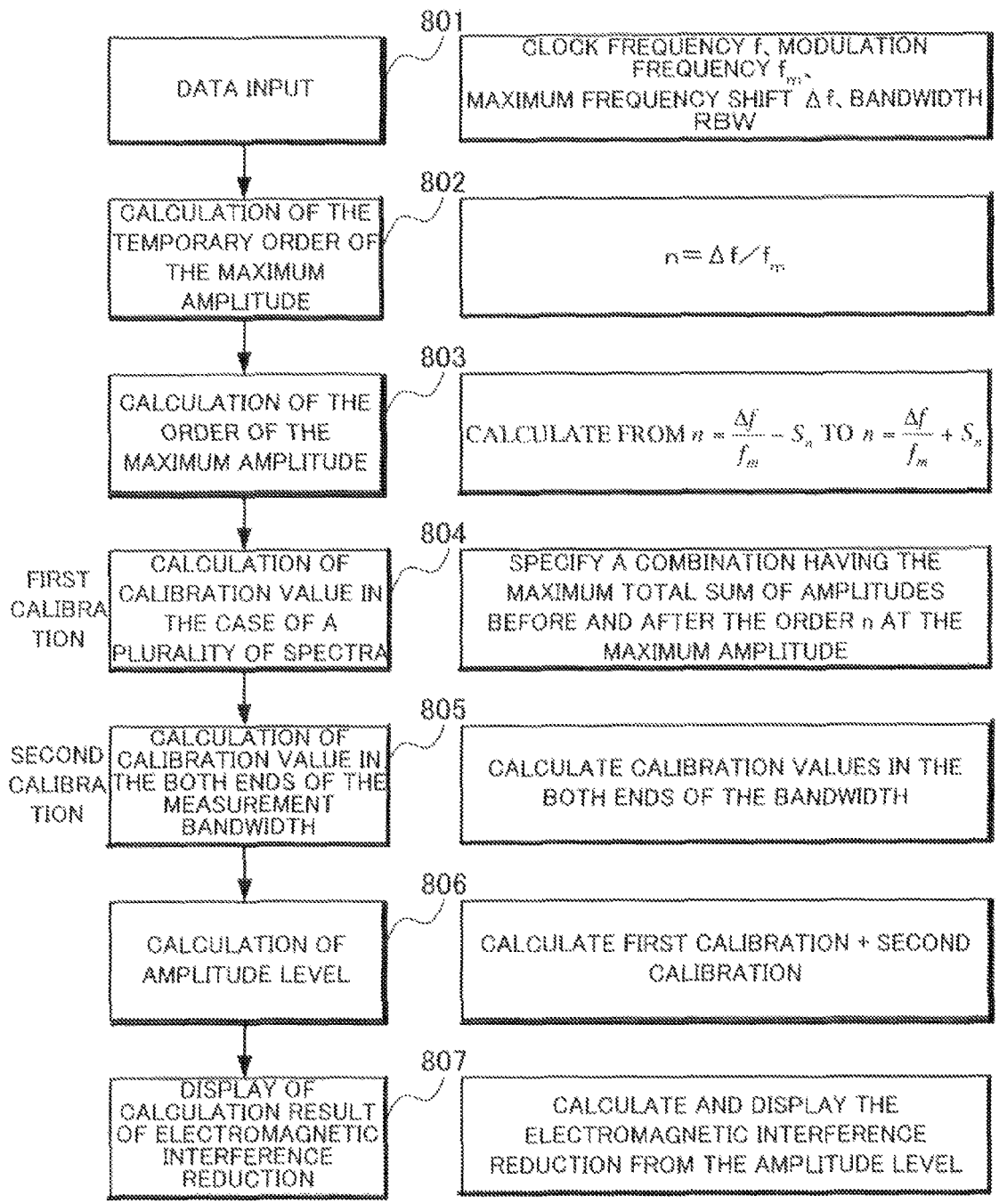
FIG. 8 is a flow chart for use in describing the processing performed by an electromagnetic interference reduction calculation device according to the first embodiment of the invention.

FIG. 8 is a flow chart for use in describing the processing performed by the electromagnetic interference reduction calculation device according to the embodiment. In FIG. 8, the right frames in the flow chart are to describe the corresponding steps roughly.

Referring to FIG. 8, numerical data is supplied at first by the input means (Step 801).

As the parameters necessary for calculation, clock frequency f, modulation frequency $f_m$, maximum frequency shift $\Delta f$, and measurement bandwidth RBW of a measurement device are entered from an input unit such as a keyboard. When the maximum frequency shift has to be required from the modulation degree (%) given to a clock frequency, the modulation degree is entered, hence to require the maximum frequency shift from $\Delta f = f \times$(modulation degree/100).

A temporary order of the Bessel function having the maximum amplitude is required by using the relationship $n = \Delta f/f_m$ (Step 802).

Here, the temporary order of the Bessel function indicates n. As mentioned above, the Bessel function gets the maximum amplitude in the order of the vicinity of the temporary order n.

Calculation is performed to find the Bessel function having the maximum amplitude from the order of $n = \Delta f/f_m - S_n$ to the order of $n = \Delta f/f_m + S_n$, hence to determine the order giving the maximum amplitude (Step 803).

The amplitude corresponding to the order n giving the maximum amplitude and the amplitudes corresponding to the orders before and after n are added together, and a combination of the maximum total sum of the amplitudes is determined, hence to estimate the first calibration value for calibrating the amplitude of the order n (Step 804).

This time, the second calibration value is estimated at the both ends of the measurement bandwidth (Step 805).

The first calibration value and the second calibration value are added, hence to estimate the amplitude (Step 806).

By using thus calculated amplitude, the electromagnetic interference reduction is estimated and displayed (Step 807).

According to the above processing, it is possible to estimate the electromagnetic interference reduction when a user enters data.

Figure 9:
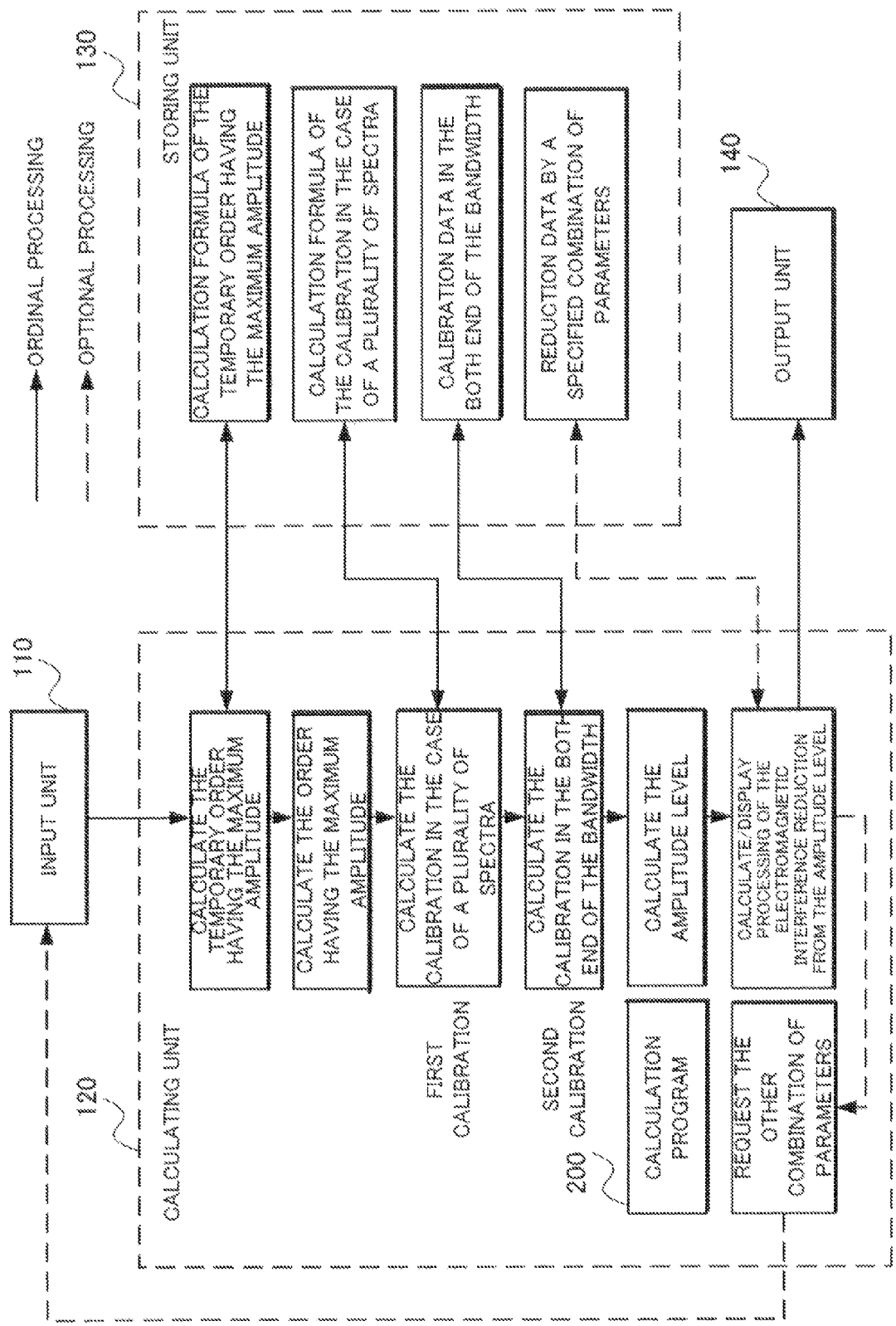
FIG. 9 is a view showing the structure of the electromagnetic interference reduction calculation device according to the first embodiment of the invention.

FIG. 9 is a view showing the structure of an electromagnetic interference reduction calculation device according to the embodiment.

The electromagnetic interference reduction calculation device according to the embodiment comprises an input unit 110, a calculating unit 120, a storing unit 130 and an output unit 140.

The input unit 110 enters the setting parameters for spectrum diffusion. When calculating the electromagnetic interference reduction of clock waveform, it enters clock frequency, modulation frequency, maximum frequency shift, and measurement bandwidth.

The calculating unit 120 calculates electromagnetic interference reduction through spectrum diffusion.

At this stage, the temporary order of the Bessel function giving the maximum amplitude can be calculated and the order of the Bessel function giving the maximum amplitude can be calculated.

Calibration value in the case of a plurality of spectra can be calculated and the calibration values at the both ends of the measurement bandwidth can be calculated.

The calculating unit 120 calculates amplitude, hence to estimate the electromagnetic interference reduction.

The storing unit 130 stores the data necessary for calculating by the calculating unit 120.

The output unit 140 outputs the electromagnetic interference reduction calculated by the calculating unit 120.

According to the above mentioned embodiment, when a measurement device having a given measurement bandwidth calculates the electromagnetic interference reduction through spectrum diffusion, when the measurement bandwidth of the electromagnetic interference reduction which has to be calibrated by measurement is wider than the modulation frequency, the electromagnetic interference reduction is estimated from the maximum total sum of the amplitudes of all the spectra included in the measurement bandwidth, thereby making it unnecessary to calibrate the electromagnetic interference level, which has been required due to the influence to estimate the electromagnetic interference reduction only through calculation.

With respect for the electromagnetic interference reduction calculation device of the invention, its operation may be realized not only in a way of hardware but also in a way of software by running a calculation program (application) 200 for executing the above calculations, on a computer, that is, an electromagnetic interference reduction calculation device. The calculation program 200 is stored in a magnetic disk, a semiconductor memory, and the other recording medium, and loaded from the recording medium into the electromagnetic interference reduction calculation device to execute the operation, thereby estimating the above numerical information.

Second Embodiment

This time, a second embodiment of the invention will be described using the drawings.

An example of an electronic circuit with the maximum electromagnetic interference reduction will be described in this embodiment, based on the calculation method according to the first embodiment.

According to the calculation method described in the first embodiment, it is also possible to set the spectrum diffusion of an electronic circuit, using the respective values of the clock frequency, the maximum frequency shift, the measurement bandwidth, and the modulation frequency, after estimating the modulation frequency giving the maximum electromagnetic interference reduction, when the clock frequency, the maximum frequency shift, and the measurement bandwidth are constant.

Referring to FIG. 5, it is found that when the influence by the measurement bandwidth of a measurement device is not taken into account, the calculated value (graph of RBW=3 kHz, the value indicated by ●) of the reduction effect decreases according as the modulation frequency increases.

While, when the calibration is necessary, the calculated value (graph of RBW=100 kHz, the value indicated by |) of the reduction effect increases in the effect according as the modulation frequency increases.

These two graphs approach at the frequency where the modulation frequency becomes equal to the measurement bandwidth of a measurement device. An intersection of these two graphs depends on the filter property as mentioned below.

The intersection of the two graphs appears at $f_m$=RBW when an ideal rectangular filter property is obtained such that the sensibility reduction rapidly falls down in the band exceeding the measurement bandwidth. While, in the case of the filter property deviated from the actual rectangle as shown in FIG. 7, the intersection is deviated to the right side, that is, toward the larger modulation frequency $f_m$.

According to the result, it is found that the modulation frequency $f_m$ having the maximum reduction effect of the electromagnetic interference appears when it becomes substantially equal to the frequency of the measurement bandwidth of a measurement device. By setting the modulation frequency $f_m$ at the same value of RBW, the substantially maximum effect can be obtained.

When a measurement bandwidth is determined in the regular standards of a target measurement (in CISPR22 of Comittie International Special des Perturbations Radioelectrique and in VCCI standard based on this international standards), as mentioned in Background Art, it is preferable that, by using this effect, the modulation frequency is set at 9 kHz according to the spectrum diffusion technique when the maximum reduction effect is expected in the frequency range from 150 kHz to 30 MHz, the modulation frequency is set at 120 kHz when the maximum reduction effect is expected in the frequency range from 30 MHz to 1 GHz, and the modulation frequency is set at 1 MHz when the maximum reduction effect is expected in the frequency exceeding 1 GHz.

Due to the influence of the above filter property, the maximum reduction effect of the electromagnetic interference can be obtained when the modulation frequency $f_m$ exceeds the measurement bandwidth. Taking the filter property into account, the modulation frequency $f_m$ having the maximum reduction effect of the electromagnetic interference is in the range from the measurement bandwidth to the frequency exceeding the measurement bandwidth.

Figure 10:
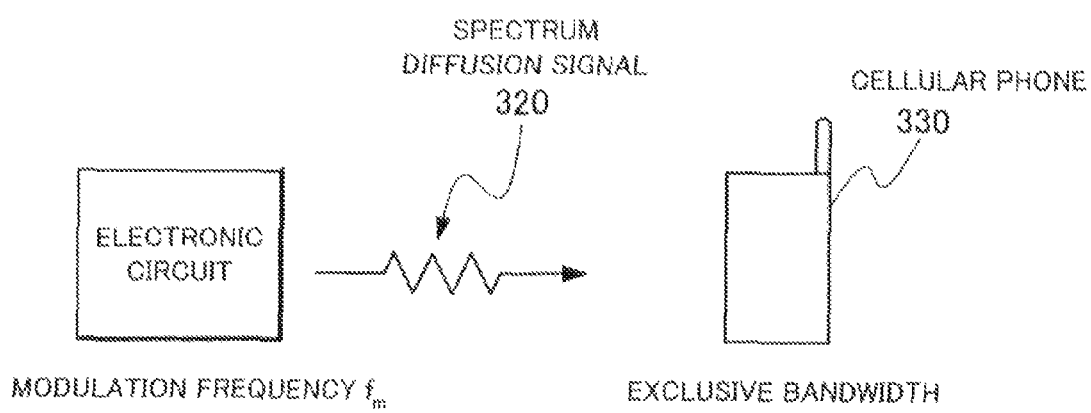
FIG. 10 is a view showing an interference of a spectrum diffusion signal from an electronic circuit to a cellular phone according to a second embodiment of the invention.

FIG. 10 is a view showing an interference of spectrum diffusion signal 320 from an electronic circuit 310 to a cellular phone 330, according to the embodiment.

In order to minimize the interference from the electronic circuit 310 to the cellular phone 330, the modulation frequency $f_m$ of the spectrum diffusion signal 320 has to be equal to the exclusive bandwidth of the cellular phone, 12.5 kHz or 25 kHz. When measuring the electromagnetic interference, it is defined that the measurement bandwidth has to be equal to the exclusive bandwidth of a device to be interfered.

As mentioned above, although the invention has been described using the preferred embodiments, the invention is not always restricted to the above embodiments but various modifications can be made within the scope of the technical spirit.

According to the electromagnetic interference reduction calculation method, device, calculation program, and its electronic circuit of the invention, the following effects can be achieved.

First, in the calculation of the electromagnetic interference reduction through the spectrum diffusion, which reduction is measured by a measurement device having a given measurement bandwidth, when the measurement bandwidth of the electromagnetic interference reduction requiring the calibration through measurement is wider than the modulation frequency, the electromagnetic interference reduction is estimated from the maximum total sum of the amplitudes of all the spectra included in the measurement bandwidth, thereby making the calibration through measurement unnecessary and making it possible to estimate the electromagnetic interference reduction only through the calculation.

Second, when adding the amplitudes of all the spectra included in the measurement bandwidth, since the influence of the sensibility reduction of a measurement device is calibrated on the spectra in the vicinity of the frequency at the ends of the measurement bandwidth, the electromagnetic interference reduction can be estimated through calculation at higher precision.

Third, since the spectrum diffusion is performed on an electronic circuit under the condition that the estimated electromagnetic interference reduction gets the maximum value, an electronic circuit device having the maximum electromagnetic interference can be manufactured.

The invention claimed is:
1. A method of calculating electromagnetic interference reduction through spectrum diffusion that is a means of reducing electromagnetic interference, the method comprising:

inputting clock frequency of a target electromagnetic interference signal, modulation frequency used for said spectrum diffusion, maximum frequency shift, and measurement bandwidth of a measurement device as data from an input unit;

calculating electromagnetic interference reduction for every frequency which appears by modulation;

calibrating said electromagnetic interference reduction in consideration of influence by said measurement bandwidth of said measurement device; and calibrating said electromagnetic interference reduction in consideration of influence by a filter property of a band filter of said measurement device, wherein said calibrating said electromagnetic interference reduction in consideration of influence by said measurement bandwidth of said measurement device comprises:

adding one to an integral part of a value obtained by dividing said bandwidth by said modulation frequency, setting the obtained value as the number of frequency spectra for calculation of electromagnetic interference reduction, and performing calibration of said electromagnetic interference reduction by using a value obtained by adding up amplitudes of all frequency spectra, wherein said calibrating said electromagnetic interference reduction with influence by a filter property of a band filter of said measurement device comprises:

setting said filter property of said band filter in advance by using a typical value of said measurement device, and performing calibration of said electromagnetic interference reduction by using reduction value by said filter property for every target frequency.

2. The calculation method of electromagnetic interference reduction according to claim 1, wherein using a value obtained by dividing a value obtained by multiplying said clock frequency by modulation degree (%) for said spectrum diffusion by 100 as said maximum frequency shift.

3. The calculation method of electromagnetic interference reduction according to one of claim 1 or claim 2, wherein the maximum total sum of said amplitudes is calculated by using the amplitudes of said different orders of the Bessel functions.

4. The calculation method of electromagnetic interference reduction according to one of claim 1 or claim 2, wherein when calculating a spectrum of harmonic wave using the Bessel function, which harmonic wave is obtained by performing the integral multiple of the frequency of a basic wave included in said electromagnetic interference signal generated from the frequency spectrum of said electromagnetic interference signal, calculation of the Bessel function is performed on a plurality of different orders, from the order of the Bessel function corresponding to a value which is obtained by subtracting said integral multiple value of a value obtained by adding one to the integral part of the value obtained by dividing said measurement bandwidth by said modulation frequency from a value obtained by dividing by said modulation frequency, said integral multiple value of the maximum frequency shift that is the expansion of the frequencies set through said spectrum diffusion of said basic wave, to the order of the Bessel function corresponding to the value obtained by adding said integral multiple value to the value obtained by dividing said integral multiple of said maximum frequency shift by said modulation frequency, and the amplitude of the spectrum having the maximum amplitude is calculated from said amplitude of the order of the Bessel function having the maximum amplitude, of the plurality of different orders of the Bessel functions.

5. The calculation method of electromagnetic interference reduction according to claim 1 or claim 2, wherein when generating a plurality of spectra from the frequency spectrum of said electromagnetic interference signal through said spectrum diffusion, clock frequency, modulation frequency, maximum frequency shift, and measurement bandwidth are used as input data to set said spectrum diffusion.

6. A device for calculating electromagnetic interference reduction through spectrum diffusion that is a means of reducing electromagnetic interference, comprising:

an input unit which enters a setting condition of the spectrum diffusion, a calculating unit which calculates electromagnetic interference reduction through the spectrum diffusion, and an output unit which supplies calculation result of said electromagnetic interference reduction, in which said calculating unit inputs clock frequency of a target electromagnetic interference signal, modulation frequency used for said spectrum diffusion, maximum frequency shift, and measurement bandwidth of a measurement device as data from said input unit, calculates said electromagnetic interference reduction for every frequency which appears by modulation, calibrates said electromagnetic interference reduction in consideration of influence by said measurement bandwidth of said measurement device and calibrates said electromagnetic interference reduction in consideration of influence by a filter property of a band filter of said measurement device, wherein, when calibrating said electromagnetic interference reduction in consideration of influence by said measurement bandwidth of said measurement device, said calculating unit adds one to an integral part of a value obtained by dividing said bandwidth by said modulation frequency, sets the obtained value as the number of frequency spectra for calculation of electromagnetic interference reduction, and performs calibration of said electromagnetic interference reduction by using a value obtained by adding up amplitudes of all frequency spectra, and wherein, when calibrating said electromagnetic interference reduction in consideration of influence by a filter property of a band filter of said measurement device, said calculating unit sets said filter property of said band filter in advance by using a typical value of said measurement device, and performs calibration of said electromagnetic interference reduction value by said filter property for every target frequency.

7. The calculation device of electromagnetic interference reduction according to claim 6, wherein said calculating unit uses a value obtained by dividing a value obtained by multiplying said clock frequency by modulation degree (%) for said spectrum diffusion by 100 as said maximum frequency shift.

8. The calculation device of electromagnetic interference reduction according to one of claim 6 or claim 7, wherein said calculating unit calculates the maximum total sum of said amplitudes by using the amplitudes of said plurality of different orders of the Bessel functions.

9. The calculation device of electromagnetic interference reduction according to claim 6 or claim 7, wherein
when calculating a spectrum of harmonic wave using the Bessel function, which harmonic wave is obtained by performing the integral multiple of the frequency of a basic wave included in said electromagnetic interference signal generated from the frequency spectrum of said electromagnetic interference signal,
said calculating unit calculates the Bessel function on a plurality of different orders, from the order of the Bessel function corresponding to a value which is obtained by subtracting said integral multiple value of a value obtained by adding one to the integral part of the value obtained by dividing said measurement bandwidth by said modulation frequency from a value obtained by dividing by said modulation frequency, said integral multiple value of the maximum frequency shift that is the expansion of the frequencies set through said spectrum diffusion of said basic wave, to the order of the Bessel function corresponding to the value obtained by adding said integral multiple value to the value obtained by dividing said integral multiple of said maximum frequency shift by said modulation frequency, and
calculates the amplitude of the spectrum having the maximum amplitude, from said amplitude of the order of the Bessel function having the maximum amplitude, of the plurality of different orders of the Bessel functions.

10. The calculation device of electromagnetic interference reduction according to claim 6, wherein
said input unit enters basic frequency, modulation frequency, maximum frequency shift, and measurement bandwidth of an electromagnetic interference signal.

* * * * *

UNITED STATES PATENT AND TRADEMARK OFFICE
CERTIFICATE OF CORRECTION

PATENT NO. : 7,953,566 B2
APPLICATION NO. : 11/573883
DATED : May 31, 2011
INVENTOR(S) : Takashi Yoshinaga It is certified that error appears in the above-identified patent and that said Letters Patent is hereby corrected as shown below:

In the Specification
Column 1, Line 9: delete "particularly" and insert -- particularly, --
Column 1, Line 10: after "interference" insert -- reduction --
Column 2, Line 25: after "method of" insert -- the --
Column 2, Line 63: delete "bandwidth. In" and insert -- bandwidth, in --
Column 3, Line 66: after "than" insert -- the spectrum having the maximum amplitude and --
Column 4, Line 60: delete "embodiment" and insert -- embodiments --
Column 5, Line 7: delete "The" and insert -- This --
Column 5, Line 9: delete "102)" and insert -- 103) --
Column 5, Line 20: after "that" insert -- a --
Column 5, Line 28: delete "(1064)" and insert -- (1964) --
Column 5, Line 50: delete "frequency." and insert -- frequency, --
Column 6, Line 26: before "the" insert -- of --
Column 7, Line 5: delete "not" and insert -- no --
Column 9, Line 12: after "$n_{max}-2$," insert -- ..., --
Column 9, Line 32: before "1.25%," insert -- at --
Column 9, Line 44: delete "RBW32 100kHz," and insert -- RBW=100kHz, --
Column 10, Line 17: after "method" insert -- of --
Column 10, Line 56: delete "FIG. 1" and insert -- FIG. 1, --
Column 10, Line 58: delete "a" and insert -- at --
Column 11, Line 22: delete "outer" and insert -- center --
Column 11, Line 59: delete "provided" and insert -- provides --
Column 12, Line 58: delete "calculating" and insert -- calculation --
Column 13, Line 5: after "influence" insert -- of the measurement bandwidth, and making it possible --
Column 14, Line 60: delete "maximum" and insert -- minimum --

Signed and Sealed this
Thirtieth Day of July, 2013

Teresa Stanek Rea
*Acting Director of the United States Patent and Trademark Office*